(12) United States Patent
Cho et al.

(10) Patent No.: US 6,928,022 B2
(45) Date of Patent: Aug. 9, 2005

(54) WRITE DRIVER CIRCUIT IN PHASE CHANGE MEMORY DEVICE AND METHOD FOR APPLYING WRITE CURRENT

(75) Inventors: Beak-Hyung Cho, Osan-si (KR); Choong-Keun Kwak, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/969,697

(22) Filed: Oct. 20, 2004

(65) Prior Publication Data

US 2005/0117388 A1 Jun. 2, 2005

(30) Foreign Application Priority Data

Nov. 27, 2003 (KR) ................................. 10-2003-0084873

(51) Int. Cl.[7] .............................................. G11C 17/18
(52) U.S. Cl. ..................... 365/225.7; 365/148; 365/211
(58) Field of Search ............................ 365/148, 225.7, 365/211, 212

(56) References Cited

U.S. PATENT DOCUMENTS

| 6,545,907 B1 | * | 4/2003 | Lowrey et al. ............. 365/163 |
| 6,605,821 B1 | * | 8/2003 | Lee et al. ........................ 257/2 |
| 6,608,773 B2 | * | 8/2003 | Lowrey et al. ............. 365/100 |
| 6,781,907 B2 | * | 8/2004 | Marr ........................... 365/211 |
| 2003/0227790 A1 | * | 12/2003 | Marr ........................... 365/105 |

* cited by examiner

Primary Examiner—Andrew Q. Tran
(74) Attorney, Agent, or Firm—F. Chau & Associates, LLC

(57) ABSTRACT

A write driver circuit including a plurality of programmable fuses for a phase change memory device in which a write operation is correctly performed even in the case where a current output shift in a write current generation circuit; or in the case where a phase change memory cell having a phase change property shift due to an external factor or due a process change. The write driver circuit includes a write current control unit for outputting a first or second level of voltage selected, by selecting one of a first or second programmable current path, based on whether a first or second selection pulse signal is applied; and a current driving unit for generating a write current controlled by the output voltage of the write current control unit. Each of the first and second programmable current paths includes fuses that can be programmed to adjust their resistance to adjust the respective selected output voltage to compensate for the current output shift in the write current generation circuit or for the phase change memory cell having the phase change property shift.

33 Claims, 12 Drawing Sheets

WRITE DRIVER CIRCUIT IN PHASE CHANGE MEMORY DEVICE AND METHOD FOR APPLYING WRITE CURRENT

CROSS-REFERENCE TO RELATED APPLICATION

This application claims the benefit of Korean Patent Application No. 2003-0084873, filed on Nov. 27, 2003, the disclosure of which is hereby incorporated herein by reference in its entirety.

BACKGROUND

1. Technical Field

The present invention relates to a phase-change memory device. More particularly, the present invention relates to a write driver circuit in a phase change memory device and a method for applying a write current.

2. Discussion of the Related Art

Random Access Memory (RAM) is commonly used to store data in electronic systems, such as a computer system, communication equipment, digital cameras, and other electronic devices.

A non-volatile RAM memory cell may include a phase change material. Phase change memory devices use phase change materials, i.e., materials that can be electrically switched between a generally amorphous and a generally crystalline state, for electronic memory application. Typical phase change materials suitable for such application include those utilizing various chalcogenide elements. Chalcogenide phase change memory operates by switching between a high resistance amorphous state and a low resistance crystalline state by heating the chalcogenide storage medium.

As used herein, the term Phase change memory (PC-RAM or PRAM), are any RAMs that store data using a conductive/resistive element having two states with different resistances, and includes Chalcogenide RAM (C-RAM), Ovonic Unified Memory (OUM), Programmable Metallization Cell RAM (PMC-RAM or PMCm), Resistance RAM (RRAM) and also includes those RAMs with metal dissolved in chalcogenide glass which form a metal short across the chalcogenide for the low resistance state, called the programmable metallization chalcogenide RAMs (PMC-RAM or PMCm). The Resistance RAM or RRAM uses a phase change metal oxide or PCMO in place of the chalcogenide. Also a Polymer Resistance memory uses current to create a reversible conductive path through a polymer.

Data can be stored in a phase change memory (PC-RAM) cell composed of the phase change material by changing the phase of the material to one of two detectable physical states. For example, a first physical state of the phase change material may include a high resistance state, and a second physical state-of the material may include a low resistance state. If the high resistance state indicates a binary "1," the low resistance state indicates a binary "0". Phase change memory (PC-RAM) are generally "non-volatile" in that, when set in either a crystalline, semi-crystalline, amorphous, or semi-amorphous state representing a resistance value, that value is retained until reset.

A phase change memory device typically includes a memory cell array having a plurality of phase change memory cells and may be employed in the electronic system as a substitute for a volatile RAM device such as DRAM.

FIG. 1 is a circuit block diagram of a portable electronic system illustrating an example of the use of a conventional phase change memory (PC-RAM) device 10. A phase change memory device 10, operatively connected to a microprocessor 4 through a bus line L3, functions as a main memory of the portable electronic system. A battery 2 supplies electrical power to the microprocessor 4, to an I/O (Input/Output) circuit 6, and to the phase change memory device 10 through a power supply line L4. If received data is provided to the I/O 6 through the line L1, the microprocessor 4 receives and processes the received data through a line L2, and then applies the received data or processed data to the phase change memory device 10 through the bus line L3. The phase change memory device 10 stores the (received or processed) data in its phase change memory cells. Further, the data stored in the memory cells of the phase change memory device 10 may be read by the microprocessor 4 and may be outputted to exterior circuits through line L2, the I/O circuit 6, and line L2.

Even when electrical power from the battery 2 is not supplied to the power supply line L4, (nor to the phase change memory device 10) the data stored in the memory cells of the phase change memory device 10 is not lost, due to the non-volatile storage properties of the phase change material. Thus, the phase change memory device 10 is a non-volatile memory device, and is different from a DRAM in this respect. Furthermore, the phase change memory device 10 also has high-speed operation and low power consumption properties.

FIG. 2 is a schematic circuit and block diagram of the phase change memory device 10 shown in FIG. 1. Referring to FIG. 2, the functional blocks of the phase change memory device 10 are the same as in a typical DRAM except for the phase change memory cells (e.g., cell 52).The phase change memory device 10 includes an address buffer and signal generation circuit 20, a row decoder 30, a column path and column decoder 40, a write driver circuit 100, a read amplification circuit 60, and a data functional blocks are somewhat different from those of corresponding blocks of the DRAM because of special read and write operation properties of the phase change memory cells (e.g., cell 52).

In FIG. 2, a unit memory cell 52, the basic unit of a memory cell array and sense amplifier 50 is composed of: an access transistor NT and a variable resistor GST. The variable resistor GST corresponds to the phase change material. A gate of the access transistor NT is connected to a word line WL forming a row of the memory cell array., The variable resistor GST is connected between a bit line BL and the access transistor NT. The bit line BL defines a column of the memory cell array.

FIG. 3 is a state diagram showing state changes for the phase change material in the phase change memory cell 52 in FIG. 2. The phase change material, which functions as the variable resistor GST, experiences state changes as shown in FIG. 3. Referring to FIG. 3, there is shown a phase change material film 55 sandwiched between an upper electrode 56 and a lower electrode 54. The phase change material film 55 may be composed of a phase change material, for example, $Ge_xSb_yTe_2$, the resistivity (resistance) of which is changed when its phase becomes crystalline or amorphous, which is determined based upon temperature and heating time.

FIG. 4 shows phase change properties of the phase change material shown in FIG. 3 relative to time and temperature. Referring to FIG. 4, the horizontal axis indicates time, and the vertical axis indicates temperature T. As denoted in the graph by reference numbers 12, 10 and 14, an amorphous state of the phase change material GST may be achieved by heating the temperature of phase change material GST above a melting temperature Tm and then immediately cooling it. Further, as denoted by reference numbers 22, 20 and 24, the crystalline state may be achieved by heating the temperature of phase change material GST above the crystallization temperature Tx for a predetermined time and then cooling it. As denoted by reference numerals ST1 and ST2 (in FIG. 3), the change of the state of the phase change material GST from an amorphous state to a crystalline state is defined as "SET"; and the change of the state of the phase change material GST from the crystalline state to the amorphous state is defined as RESET. Resistance of the phase change material GST in the amorphous state is significantly higher than that of its resistance in the crystalline state.

Known methods for heating the phase change material film 55 shown in FIG. 3 includes a method using a laser beam, a method using a current, and the like. The method using a current is preferred in a memory chip embodiment. When the method using a current is applied, the phase change material film 55 changes between a SET or RESET state due to joule heating generated, which is determined by the magnitude and application time of electric current.

FIG. 5 is a diagram showing waveforms of respective current pulses applied for changing the phase change material GST shown in FIG. 3 into a first (amorphizing) or second (crystalline) state using joule heating. In FIG. 5, the horizontal axis indicates time, but the vertical axis indicates the magnitude of a current I through the phase change material GST. In FIG. 5, if current magnitudes for respective pulses (G1, G2) are compared to each other, it is seen that the magnitude of current of RESET pulse G1 is higher than that of SET pulse G2. If application times of current I are compared to each other, the application time of the SET pulse G2 is longer than that of the RESET pulse G1. The RESET pulse G1 and the SET pulse G2 of FIG. 5 represent write currents, which must be respectively applied to the memory cell to cause a binary "1" or "0" to be stored in the write operation mode.

Hereinafter, a write operation (or a program operation) to store data in the phase change memory cell 52, will be briefly described with reference to FIGS. 2 to 5. And then a read operation of sensing stored data and outputting it to the exterior of the memory will be subsequently described.

Conventionally, write data WDATA is to be stored in (written to) a phase change memory cell (e.g., 52) connected between a word line (e.g., WL1) and a bit line (e.g., BL1) in the memory cell array 50 of FIG. 2. The first word line WL1 is activated by an address decoding operation of the row decoder 30. Meanwhile, the first bit line BL1 is selected by a decoding operation of the column path and column decoder 40. The write data WDATA is applied to a write driver circuit 100 via the data input/output buffer 70. If the write data WDATA is logic "1", the write driver circuit 100 applies the RESET pulse G1 (shown in FIG. 5) to a single data line SDL as a write current If the write data WDATA is logic "0", the write driver circuit 100 applies the SET pulse G2 (shown in FIG. 5) to the single data line SDL as the write current. When the RESET pulse G1 is applied to the first bit line BL1, the phase change material film (55 in FIG. 3) of the selected phase change memory cell (e.g., 52) is heated at a temperature indicated in the AMORPHIZING RESET PULSE graph 10 of FIG. 4 and then is cooled, so that it is reset (as in the memory cell 52-1 of FIG. 3). As a result, the reset memory cell (e.g. 52) has a high resistance state, functioning as a memory cell that stores data "1". On the other hand, when the SET pulse G1 Is applied to the first bit line BL1, the phase change material film 55 of the selected phase change memory cell (e.g., 52) is heated to a temperature indicated in the CRYSTALLIZING (SET) PULSE graph 20 of FIG. 4 and then is cooled, so that it Is set (as in the memory cell 52-2 of FIG. 3). As a result, the set memory cell (e.g., 52) has a relatively lower resistance state, functioning as a memory cell that stores data "0".

Data stored in a memory cell (e.g., 52) as data "1" or "0" is read via the first bit line BL1 if the first bit line BL1 is selected. If data "1" has been stored, the level of cell pass-through current that flows from the bit line BL1 (to ground) is relatively lower since the memory cell (e.g. 52) is in a high resistance state. Otherwise, if data "0" has been stored, the level of cell pass-through current is relatively higher since the memory cell (e.g., 52) is in a low resistance state. Accordingly, whether the data stored in the memory cell (e.g. 52) is 1 or 0 can be determined by connecting and driving a current sense amplifier to each bit line. The sense amp senses the cell pass-through current. Alternatively, whether the data stored In the memory cell (e.g. 52) is 1 or 0 can be determined by connecting to the bit line a voltage sense amplifier, which senses a voltage caused by the cell pass-through current,. The data read as 1 or 0 is outputted to the data input/output buffer 70 via the column path and column decoder 40 and the read amplification circuit 60. The read amplification circuit 60 is a circuit that functions to re-amplify the data outputted from the bit line sense amplifiers.

One of the technologies for reading data from a phase change memory cell is disclosed in U.S. Pat. No. 6,608,773 to Lowrey et al. issued in Aug. 19, 2003.

One of the technologies of forming the phase change memory cell is disclosed in U.S. Pat. No. 6,605,821 to Heon Lee et al. issued in Aug. 12, 2003.

An example of technology for performing a write operation In the phase change memory device is disclosed in U.S. Pat. No. 6,545,907 to Lowrey et al. issued in Apr. 8, 2003. The U.S. Pat. No. 6,545,907 discloses a method for performing a write operation with reset and set pulses as write currents. However, there is a potential problem that a "current output shift" can occurs in a write current generation circuit, such as a write driver circuit or the like. Also there is no countermeasure for controlling the write current output in the case where a phase change memory cell having a phase change material has a "phase change property shift" caused by an external factor or a process change.

Thus, if the current output from the write current generation circuit, such as a write driver circuit or the like, is not generated as a predefined value, e.g., due to the external factor or process change, current levels of the reset pulse and the set pulse will not be generated as predefined values, thereby degrading the reliability of the write operation. Further, in the case where the phase change memory cell having the phase change material has a "phase change property shift", e.g., due to an external factor or process change, it is difficult to guarantee the reliability of the write operation even though the current levels of the reset and set pulses are applied with the predefined value. If the reliability of the write operation is degraded, it will reduce manufacture yield in production of the phase change memory device.

Accordingly, there is a need for a technology allowing the write operation to be more precisely performed by controlling the write current output from the write driver circuit for each phase change memory cell array blocks or memory chips.

SUMMARY OF THE INVENTION

The present invention provides a write driver circuit in a phase change memory device, and a method for generating and applying a write current to a phase change memory cell therein.

The phase change memory device and the method for applying a write current are capable of maximizing the reliability of a write operation even in the case where there is a current output shift in a write current generation circuit.

The present invention also provides a write driver circuit in a phase change memory device and a method for applying a write current capable of controlling an output of a write current in the case where a phase change memory cell having a phase change material has a phase change property shift caused by external factors or process change.

The present invention further provides a write driver circuit capable of controlling the intensity of a write current in order to reset or set a phase change memory cell.

The present invention further provides a write driver circuit in a phase change memory device and a method for applying a write current capable of adjusting set and reset (write) current shifted by a manufacturing process or an external factor.

The present invention further provides a write driver circuit capable of increasing and decreasing magnitudes of set and reset current using a plurality of programmable fuses.

In accordance with an exemplary embodiment of the present invention, there is provided a circuit for performing a write operation in a phase change memory device having a phase change memory cell, comprising a programmable fuse unit for adjusting the magnitude of write current (set current and/or reset current) through the phase change memory cell. The programmable fuse unit may comprise a plurality of laser-programmable fuses or electrically-programmable fuses. The phase change memory device may include a plurality of phase change memory cells having first and second resistance states arranged in a matrix form in which the phase change memory cells are connected to intersections of a plurality of word lines and a plurality of bit lines. The circuit performing a write operation may further comprise: a pulse selection unit for selecting one of first and second state pulses that are applied to change a resistance state of the phase change memory cell, in response to a logic state of the applied write data, and outputting the selected pulse as a first or second selected pulse signal; and a current driving unit for generating a write current (set current or reset current) in response to the output voltage from the write current control unit.

Preferably, the write current control unit includes a reset current control unit for establishing a first programmable current path (e.g., that includes at least one programmable fuse, or is controlled by at least one programmable fuse) in response to the first selection pulse signal. (Current flowing through the first programmable current path can be decreased by programming a fuse); a set current control unit for establishing a second programmable current path in response to the second selection pulse signal; and an output voltage control unit having a voltage output node connected to (controlled by) the first and second current paths, allowing the voltage level of the voltage output node to be decreased by programming one or more fuses, and outputting the first or second level of the voltage through the voltage output node, the voltage being dependent on the magnitude of current flowing through one of the first or second (programmable) current path.

According to another embodiment, the present invention provides a method for applying write currents to a phase change memory cell in a phase change memory device, the method comprising steps of: adjusting the magnitude of a first write current (e.g., a set current) determined by a first logic state of write data by programming a first fuse; and adjusting the magnitude of a second write current (e.g., a reset current) determined by a second logic state of write data by programming a second fuse.

In the write driver circuit in the phase change memory device and the method for applying a write current of the present invention, the write operation is performed more easily even in the case where there occurs a current output shift in the write current generation circuit or where the phase change memory cell having the phase change material has a phase change property shift due to an external factor or a process change.

BRIEF DESCRIPTION OF THE DRAWINGS

The above and other features of the present invention will become more apparent to those of ordinary skill in the art by describing in detail preferred embodiments thereof with reference to the attached drawings in which.

In the drawings, the thickness of layers and regions are exaggerated for clarity. Like numbers refer to like elements throughout the specification.

DESCRIPTION OF PREFERRED
EMBODIMENTS OF THE INVENTION

The present invention will now be described with reference to the accompanying drawings, in which preferred embodiments of the invention are shown.

Figure 1:
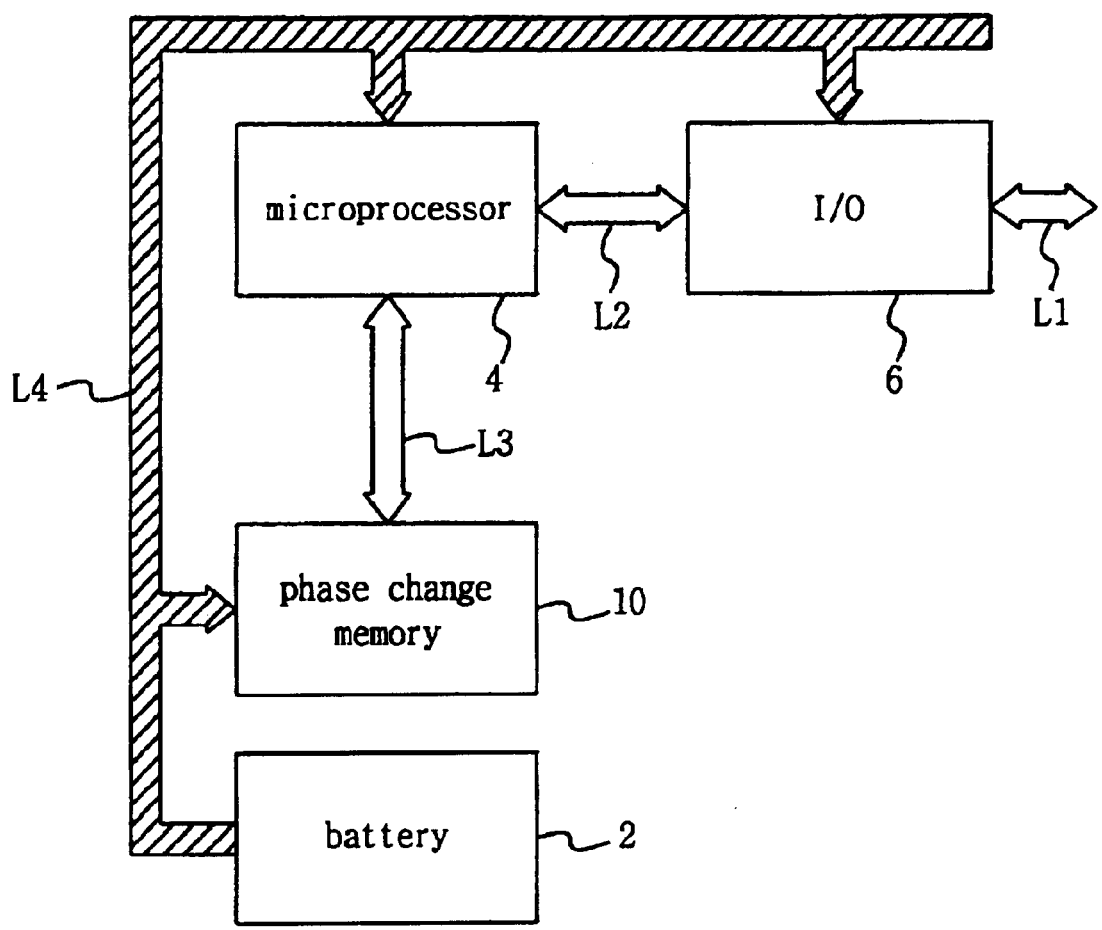
FIG. 1 is a circuit block diagram of a portable electronic system illustrating an exemplary application of a conventional phase change memory device.
Figure 2:
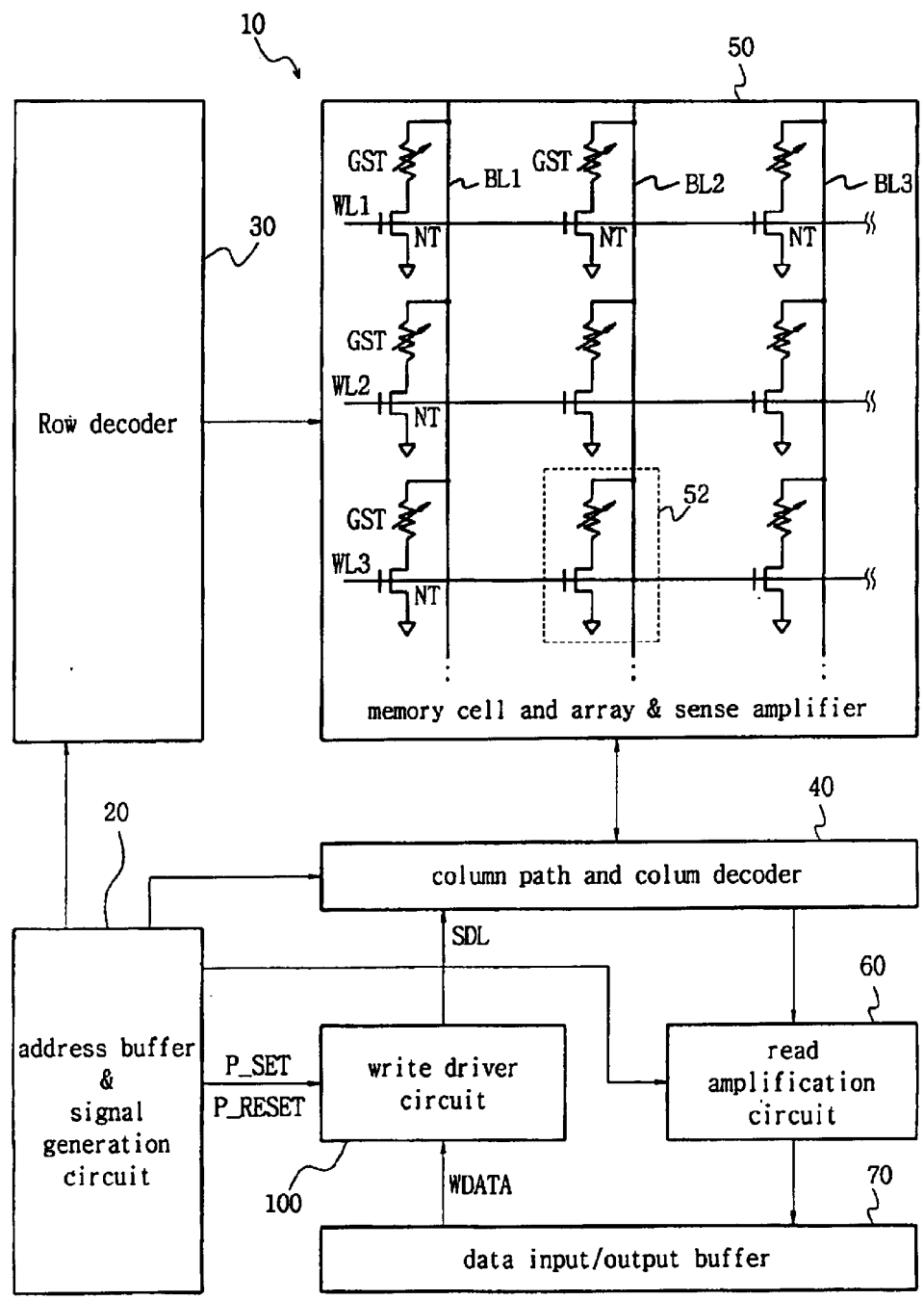
FIG. 2 is a schematic circuit and block diagram of the phase change memory device of FIG. 1.
Figure 3:
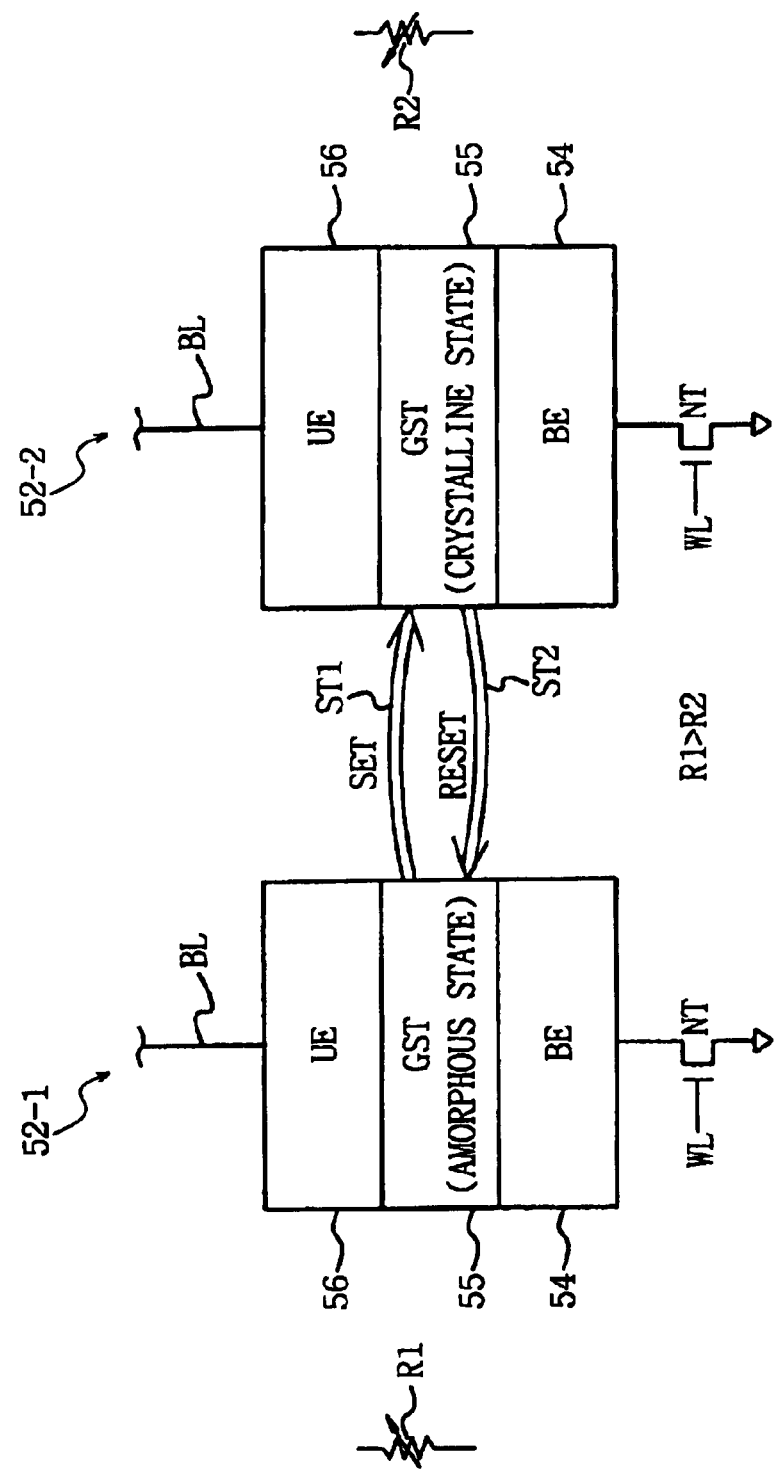
FIG. 3 is a diagram illustrating state changes with respect to the phase change material within the phase change memory cell of FIG. 2.
Figure 4:
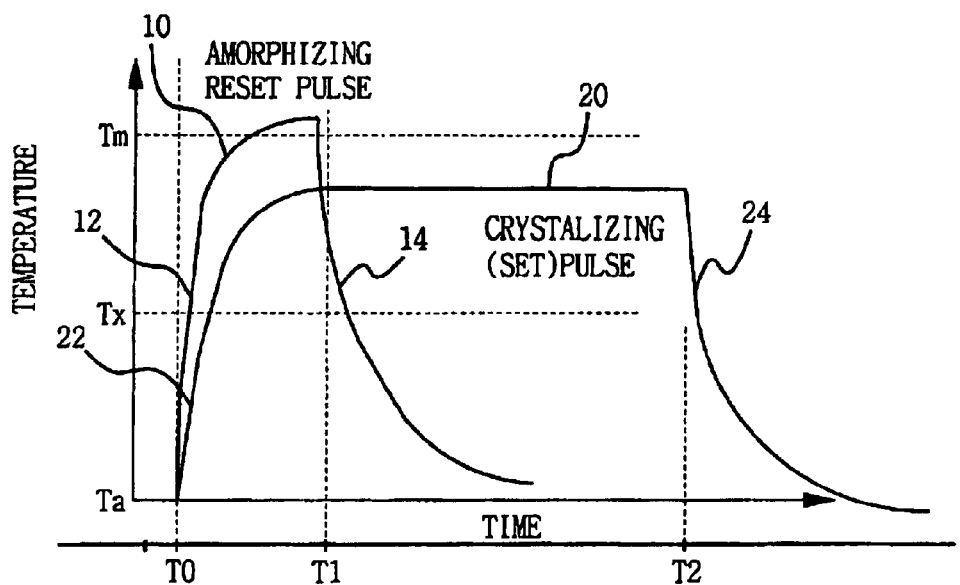
FIG. 4 is a diagram illustrating the relation of phase change properties of the phase change material shown in FIG. 3 to time and temperature.
Figure 5:
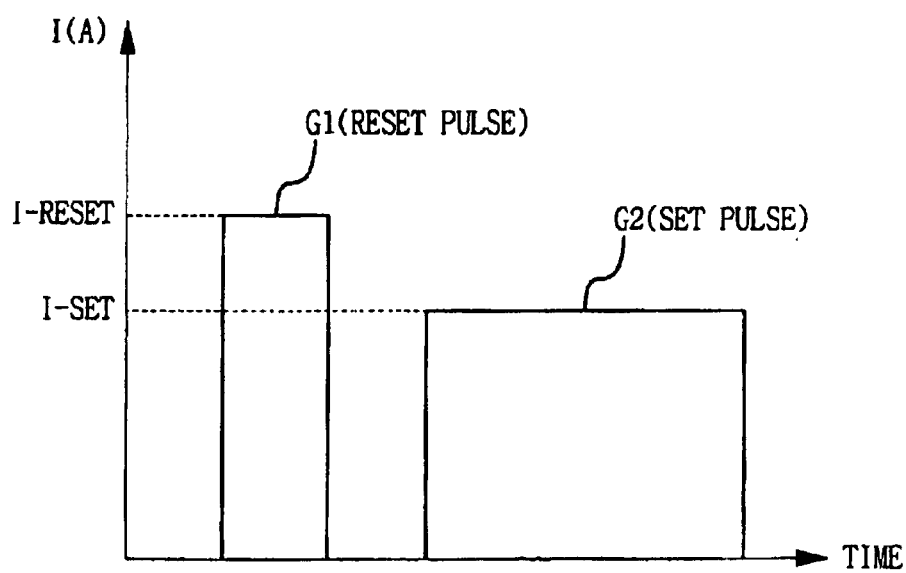
FIG. 5 is a diagram showing waveforms of a current pulse applied to change the phase change material shown in FIG. 3 into first or second state using joule heating.
Figure 6:
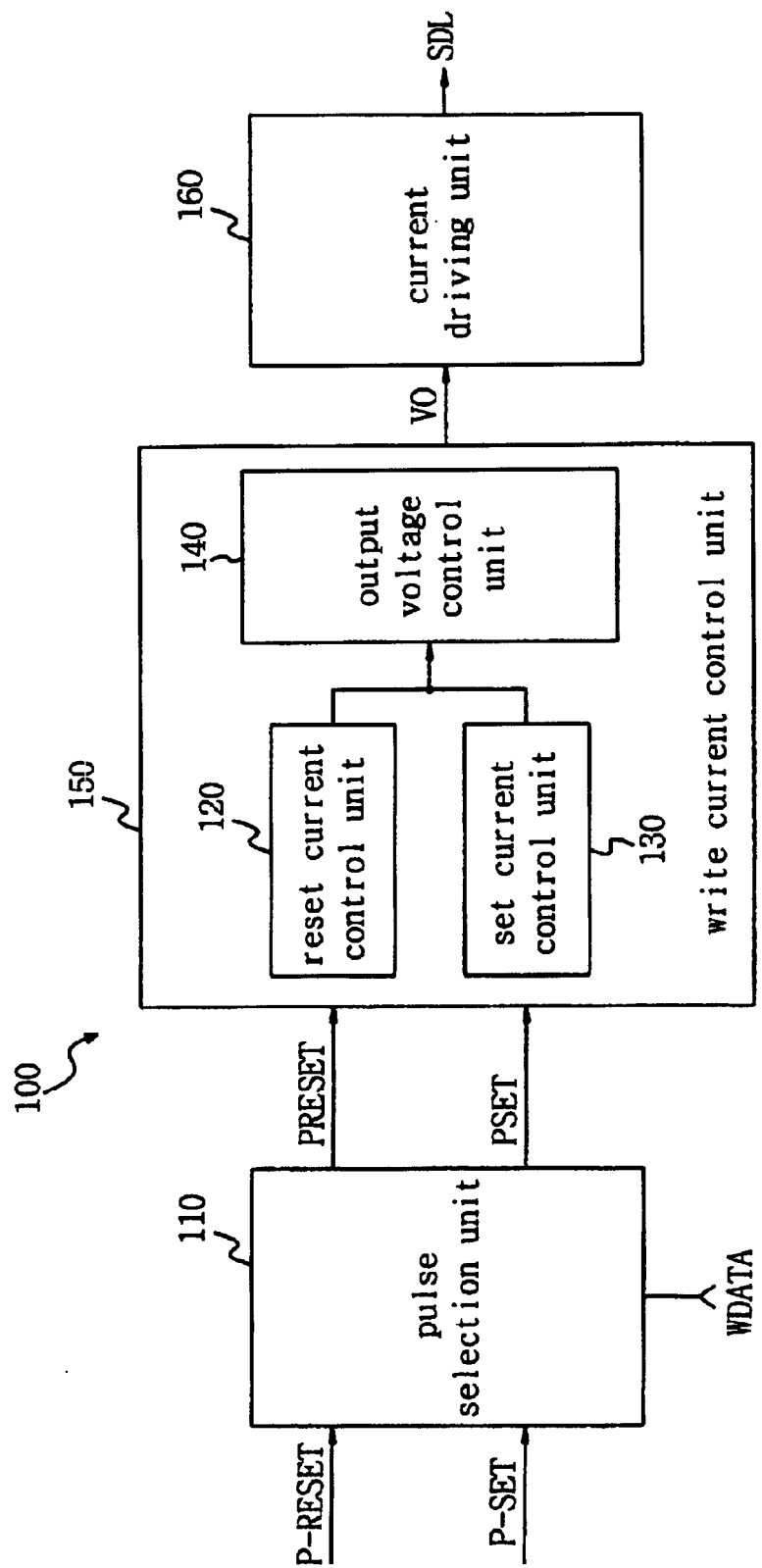
FIG. 6 is a block diagram of a write driver circuit in accordance with an embodiment of the present invention.

FIG. 6 is a block diagram of a write driver circuit in accordance with an embodiment of the present invention. A write driver circuit 100 includes a pulse selection unit 110, a write current control unit 150, and a current driving unit 160. The write current control unit 150 includes a reset current control unit 120, a set control unit 130, and an output voltage control unit 140.

The pulse selection unit 110 selects one of first and second state pulses (P_RESET and P_SET) that are applied to change the resistance state of the phase change memory cell in response to the logic state ("1" or "0") of a applied write data WDATA. The pulse selection unit 110 outputs the selected state pulse (as one of first and second selection pulse signals PRESET and PSET).

When receiving the first selection pulse signal PRESET, the write current control unit 150 establishes a first programmed current path and outputs a first controlled level of voltage to its voltage output terminal VO. When receiving the second selection pulse signal PSET, the write current control unit 150 establishes a second programmed current path and outputs a second controlled level of voltage to the voltage output terminal VO.

The current driving unit 160 generates a write current and applies the current to a line SDL in response to the output voltage VO from the write current control unit 150.

Figure 7:
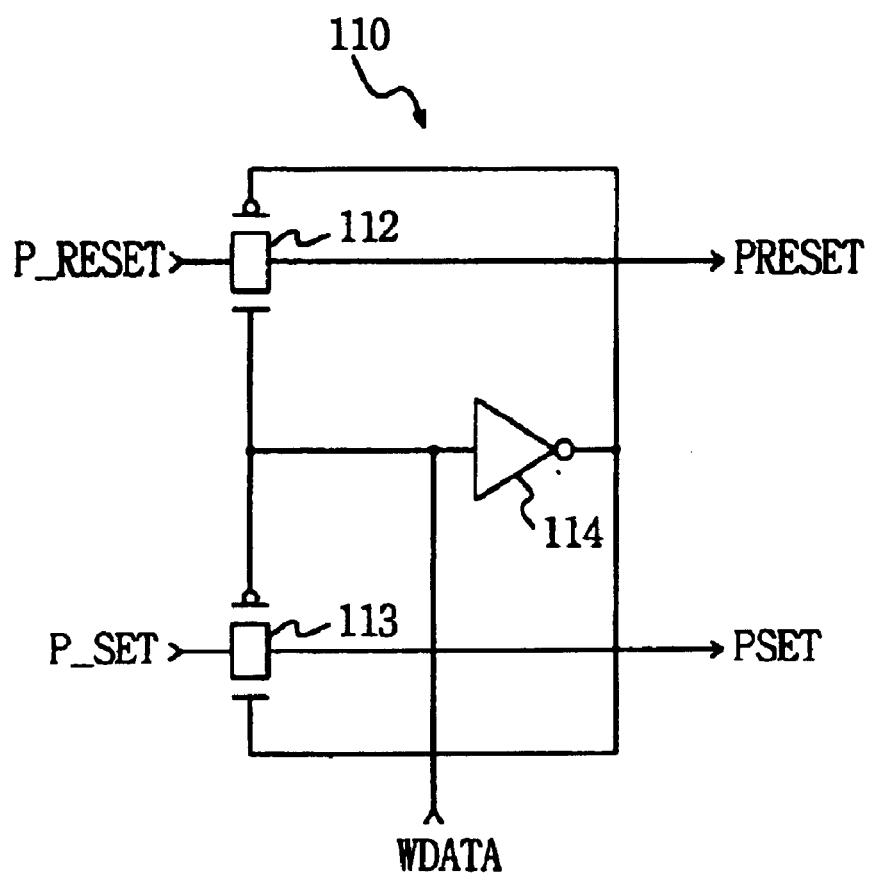
FIG. 7 is a circuit diagram showing a pulse selection unit of the write driver circuit of FIG. 6.

FIG. 7, shows circuit details of an embodiment of the pulse selection unit 110 within write driver circuit 100 of FIG. 6. In FIG. 7, there is shown a signal selecting circuit including a first transmission gate 112, a second transmission gate 113, and an inverter 114. The inverter 114 is for inverting the logic state of the write data WDATA. The first transmission gate 112 and the second transmission gage 113 receive the first and second state pulses P_RESET and P_SET at their input terminals, respectively, and receive the write data at respective gate-control terminals. Accordingly, if a logic state of the write data WDATA is high, the first transmission gate 112 is activated to pass (activate) the first selection pulse signal PRESET. On the other hand, if the logic state of the write data WDATA is low, the second transmission gate 113 is activated to pass (activate) the second selection pulse signal PSET.

Figure 8:
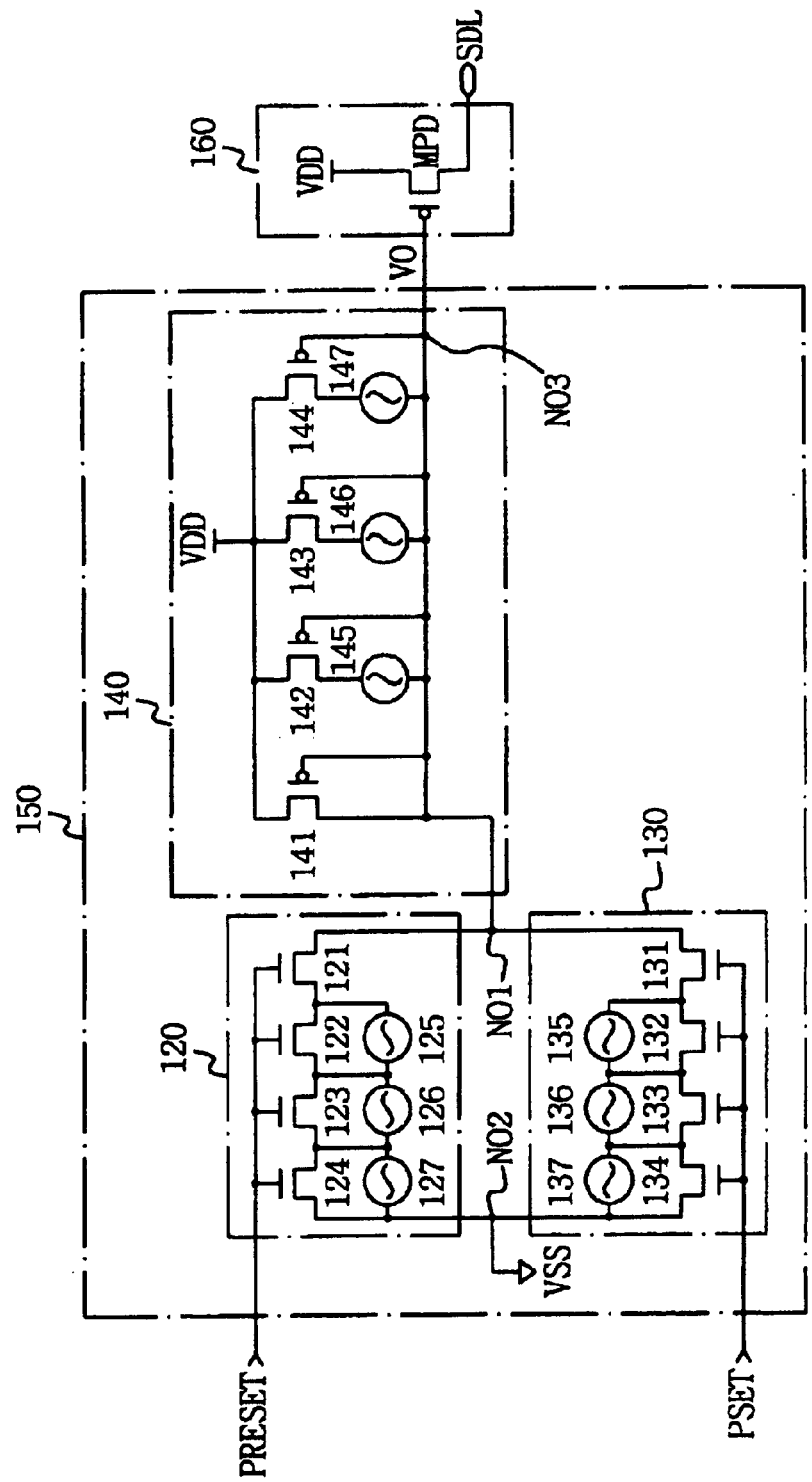
FIG. 8 is a circuit diagram of a first embodiment of the write current control unit and current driving unit of the write driver circuit of FIG. 6.

FIG. 8 is a circuit diagram showing circuit details of a first embodiment of the write current control unit 150 and the current driving unit 160 of FIG. 6. The node NO1 corresponds to a current supply terminal and the node NO2 is a ground. Current will flow from current supply terminal node NO1 through a selected one of the reset current control unit 120 and the set current control unit 130, to the ground NO2.

Referring to FIG. 8, a reset current control unit 120 is composed of first to fourth N-type (e.g., NMOS) transistors 121 to 124, and first to third fuses 125 to 127. The first to fourth N-type (e.g., NMOS) transistors 121 to 124, which are serially connected (at their drain-source channels), receive the first selection pulse signal PRESET via their respective gate terminals. The first to third fuses 125 to 127 are correspondingly connected to the (drain of source) terminals of the second, third and fourth NMOS transistors. For example, when the first fuse 125 is cut (blown), a current through the source of the first NMOS transistor 121 flows through the second NMOS transistor 122. However, when the first fuse 125 is not cut (blown), the current through the source of the first NMOS transistor 121 flows through the note at the drain of the third NMOS transistor 123 without passing through the second NMOS transistor 122.

Similarly, the set current control unit 130 is composed of first to fourth-N-type (e.g., NMOS) transistors 131 to 134, and first to third fuses 135 to 137. The first to fourth NMOS transistors 131 to 134, which are serially connected (at their drain-source channels), receive the second selection pulse signal PSET via their respective gate terminals. The first to third fuses 135 to 137 are correspondingly connected to the second to fourth NMOS transistors 132 to 134. For example, if the first fuse 135 is cut (blown), the current through (at the source of) the first NMOS transistor 131 flows through the second NMOS transistor 132. However, if the first fuse 135 is not cut, the current through (at the source of) the first NMOS transistor 131 can flow through a drain terminal of the third NMOS transistor 133 without passing through the second NMOS transistor 132.

The output voltage control unit 140 is composed of first to fourth P-type (e.g., PMOS) transistors 141 to 144, and first to third fuses 145 to 147. Source terminals of the first to fourth PMOS transistors 141 to 144 are connected to a power supply voltage VDD, and gate terminals of the transistors are connected to the voltage output stage V0 (node NO1). The drain terminals of the second to fourth PMOS transistors 142 to 144 are connected to the voltage output stage V0 via the first to third corresponding fuses 145 to 147. For example, if the first fuse 145 is cut (blown), the drain terminal of the second PMOS transistor 142 is electrically isolated from the voltage output stage V0, and accordingly there will be no driving current through the second PMOS transistor 142. As a result, if the second PMOS transistor 142 does not participate in generating the current driving, the voltage level of the node NO1 is lowered correspondingly.

Referring to FIG. 8, a current driving unit 160 is composed of a P-type (e.g., PMOS) transistor MPD. An output level of a write current of the PMOS transistor MPD, namely, the magnitude of the write current through transistor MPD (and output to line SDL) depends on (is controlled by) the voltage level developed at the node NO1 (VO).

Figure 9:
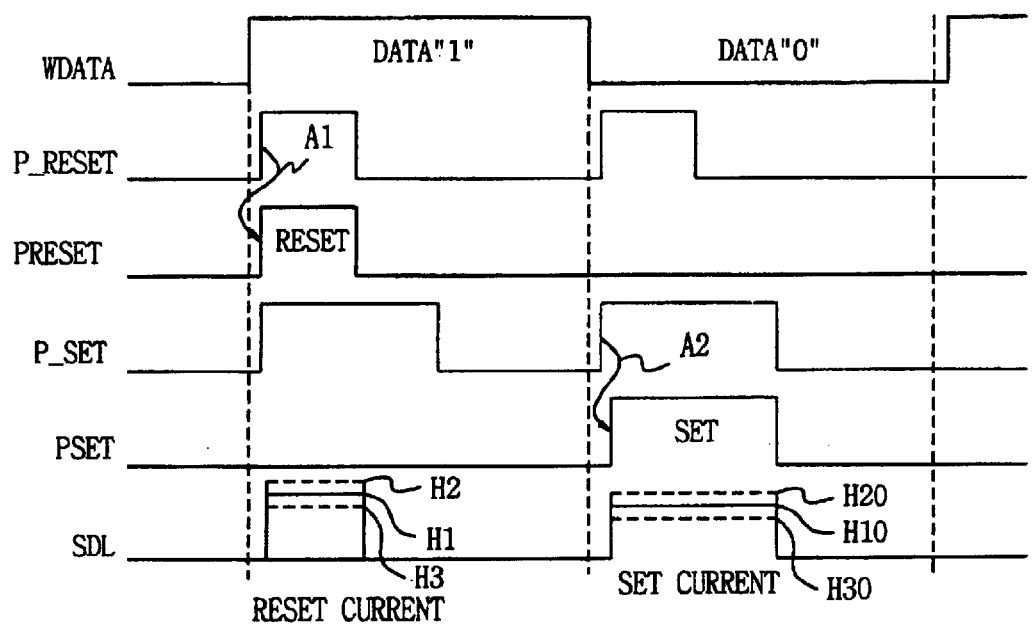
FIG. 9 is an operational timing diagram relating to a write current output of the write driver circuit of FIG. 6.

FIG. 9 is a timing diagram relating to the write current output from the write driver circuit 100 of FIG. 6. Referring to FIG. 9, the first selection pulse signal PRESET is outputted (via the first transmission gate 112 shown in FIG. 7) within the time interval of a DATA"1" during which the write data WDATA is applied as logic high (1). The first selection pulse signal PRESET is generated in response to a rising edge of the first state pulse P_RESET, which is denoted by a timing arrow A1 in FIG. 9.

On the other hand, the second selection pulse signal PSET is outputted (via the second transmission gate 113 shown in FIG. 7) within the time interval of a DATA"0" where the write data WDATA is applied as logic low (0). The second selection pulse signal PSET is generated in response to a rising edge of the second state pulse P_SET, which is denoted by a timing arrow A2 in FIG. 9.

When the pulse selection unit 110 (shown in FIGS. 6 & 7) outputs the first selection pulse signal PRESET or the second selection pulse signal PSET according to the logic state of the write data WDATA, the reset current control unit 120 or the set current control unit 130 in the write current control unit 150 starts to discharge the voltage VO at node NO1, generated in the output voltage control unit 140, through ground NO2, down to a predetermined voltage level. Thus, the output voltage VO of the output voltage control unit 140 is determined according to quantity of current flowing through node NO1 to the ground at node NO2. If the level of the output voltage VO of the output voltage control unit 140 is high, current driving capability of the PMOS transistor MPD of FIG. 8 is reduced such that the output level of the write current developed at the output line SDL is lowered. On the other hand, if the level of the output voltage VO of the output voltage control unit 140 is low, the current driving capability of the PMOS transistor MPD of FIG. 8 is Increased such that the output level of the write current developed at the output line SDL becomes higher.

FIG. 9 shows the current waveform of write (e.g., set or reset) current at SDL (through line SDL). It is necessary to reduce the magnitude of the reset current if the magnitude of the reset current is outputted at a (threshold) magnitude indicated by reference numeral H2. In that case, the first to third fuses 125 to 127 in the reset current control unit 120 of FIG. 8 may be cut to change the magnitude of the reset current to magnitude indicated by reference numeral H1. For example, the first fuse 125 may be cut by a light source, such as a laser beam, so that a current path is established through the first and second NMOS transistors 121 and 122, and through the second and third fuses 126 and 127. Since turn-on resistance of the second NMOS transistor 122 resists a current flow, quantity of current flowing through to the ground VSS is reduced and accordingly the voltage level of the node NO1 becomes higher compared with the case of where first fuse 125 is not cut. Accordingly, the current driving capability of the PMOS transistor MPD of FIG. 8 may be lowered (by cutting fuses among 125 to 127) so that the magnitude of the write current developed at the output line SDL is lowered to the magnitude indicated by the reference numeral H1

If the magnitude of the reset current is to be further lowered to the level indicated by the reference numeral H3, the second and third fuses 126 and 127 are additionally cut. Accordingly, if all of the first to third fuses 125 to 127 are cut, the voltage level of the gate terminal of the PMOS transistor MPD is lowered compared with the case where fuses 125 to 127 are not cut. Accordingly, the output level of the reset current developed at the output line SDL can be reduced from the higher level indicated by the reference numeral H2 down to the level indicated by the reference numeral H3.

The control operation of the set current is similar. The "SET CURRENT" waveform of current at SDL is shown in FIG. 9. If the set current is outputted at a magnitude indicated by the reference numeral H20, it is necessary to reduce the magnitude of the set current. In that case, the first to third fuses 135 to 137 in the set current control unit of FIG. 8 may be cut to reduce the magnitude of the set current. For example, in the case where the first fuse 135 is cut by a light source (such as a laser beam), a current path is established through the first and second NMOS transistors 131 and 132, (and the second and third fuses 136 and 137). Since the turn-on resistance of the second NMOS transistor 132 resists the current flow (from node NO1 to node NO2) the quantity of current flowing through to the ground VSS is lowered, and consequently, the voltage level of the node NO1 becomes higher compared with the case where the first fuse 135 is not cut. Accordingly, the current driving capability of the PMOS transistor MPD of FIG. 8 is reduced such that the output level of the set current developed at the output line SDL is lowered to the magnitude indicated by the reference numeral H10. In the case where the magnitude of the set current is to be further lowered to the level indicated by the reference numeral H30, the second and third fuses 136 and 137 are additionally cut. Accordingly, If all of the first to third fuses 135 to 137 are cut, the current path established is limited through only the drain-source channels of the first to fourth NMOS transistors 131 to 134 such that the quantity of discharge current is further reduced. As a result, the voltage level of the gate terminal of the PMOS transistor MPD becomes higher compared with the previous case, and the magnitude of the set current developed at the output line SDL can be lowered to the level indicated by the reference numeral H30.

On the other hand, if the magnitude of the set current is output at the level indicated by the reference numeral H30, it is necessary to increase the level of the set current. In that case, the first to third fuses 145 to 147 within the output voltage control unit 140 of FIG. 8 can be cut to increase the level of the set current. For example, if the first fuse 145 is cut, since the second PMOS transistor 142 then does not participate in the driving operation, the voltage level of the node NO1 (VO) is lowered compared with the case where the first fuse 145 is not cut. Accordingly, the current driving capability of the PMOS transistor MPD is increased so that the magnitude of the set current developed at the output line SDL is increased to the level indicated by the reference numeral H10.

As described above, even in a case where there exists a current output shift in the write current generation circuit, or the phase change memory cell having the phase change material has a phase change property shift caused by an external factor or a process change, it is possible to compensate for those shifts (to increase or decrease the reset or set current) an by programming the fuses. The plurality of fuses (e.g., 125, 126, 127, 131, 132, 133, 134, a45, 146, 147) may be collectively characterized as a programmable fuse unit. In alternative embodiments of the invention, the programmable fuse unit may be electronically (and reversibly) programmable (reprogrammable).

If the proper (predetermined) magnitude of the write current (as selected according to a logic state of the write data) is not initially provided to the phase change memory cell, the cuttable fuses can function as a programmable compensating unit that allows for the magnitude of the write current to be increased or decreased after fabrication or and even after packaging of the chip containing the PCRAM memory device.

Figure 10:
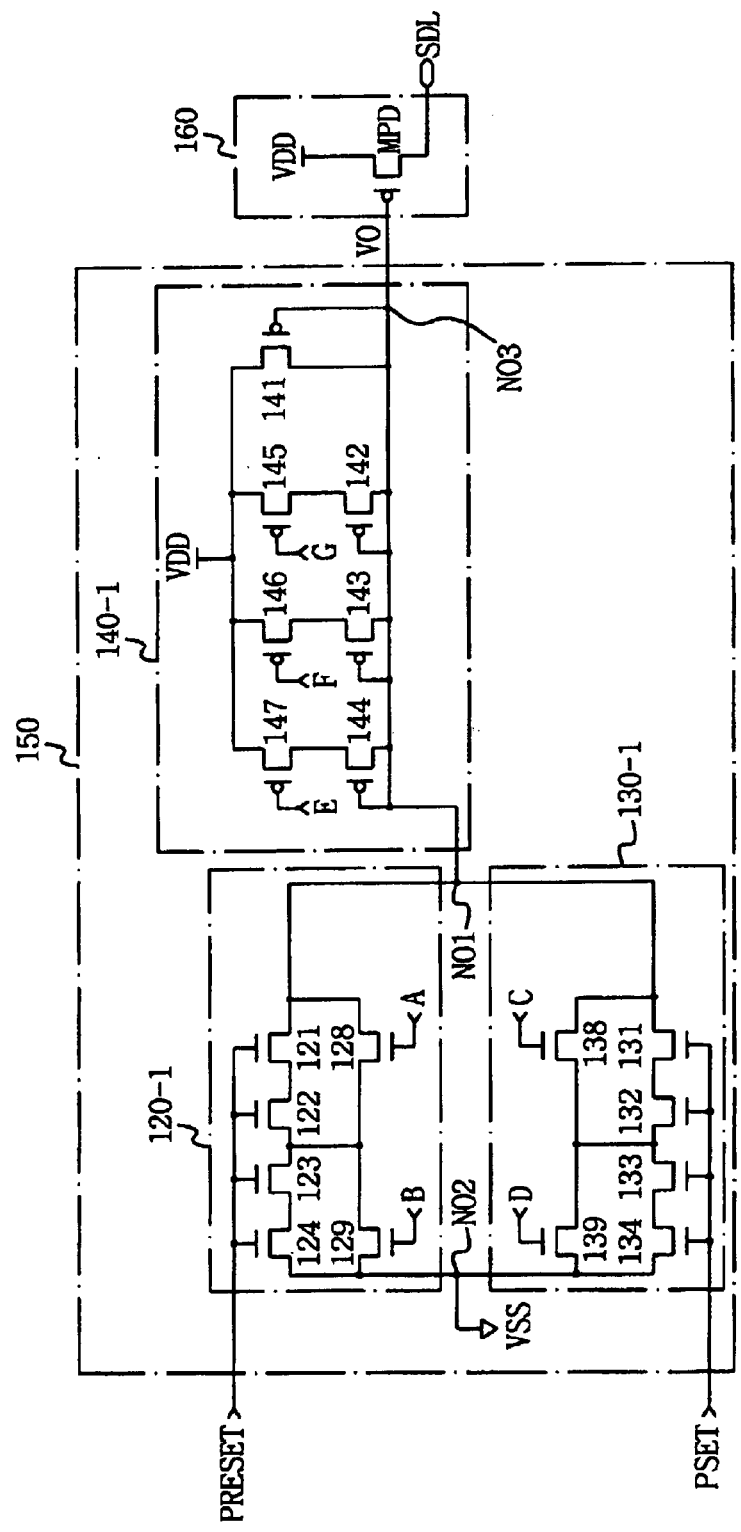
FIG. 10 is a circuit diagram of a second embodiment of the write current control unit and current driving unit of the write driver circuit of FIG. 6.

FIG. 10 is a circuit diagram showing a second embodiment of the write current control unit and current driving unit 150 of FIG. 6. Referring to FIG. 10, a reset current control unit 120-1 is composed of first to fourth N-type (e.g., NMOS) transistors 121 to 124, and fifth and sixth N-type (e.g., NMOS) transistors 128 and 129. The first to fourth NMOS transistors 121 to 124, of which are serially connected to one another (drain-to-source, receive the first selection pulse signal PRESET in common at their respective gate terminals. The fifth NMOS transistor 128 is connected in parallel with the first and second NMOS transistors 121 and 122, and the sixth NMOS transistor 129 is connected in parallel with the third and fourth NMOS transistors 123 and 124. For example, if the fifth NMOS transistor 128 is turned on, the current flowing at the drain of the first NMOS transistor 121 also flows through the drain-source channel of the fifth NMOS transistor 128. Control signals A and B are applied to the gate terminals of the fifth and sixth NMOS transistors 128 and 129, respectively, for independently controlling the conducting state of each of the fifth and sixth NMOS transistors 128 and 129.

Similarly, a set current control unit 130-1 is composed of first to fourth N-type (e.g., NMOS) transistors 131 to 134, and fifth and sixth NMOS transistors 138 and 139. The first to fourth NMOS transistors 131 to 134, of which th are serially connected with one another (drain-to-source), receive the second selection pulse signal PSET in common through their respective the gate terminals. The fifth NMOS transistor 138 is connected in parallel with the first and second NMOS transistors 131 and 132, and the sixth NMOS transistor 139 is connected in parallel with the third and fourth NMOS transistors 133 and 134. If the fifth NMOS transistor 138 is turned on, a current flowing at the drain of the first NMOS transistor 131 also flows through the drain-source channel of the fifth NMOS transistor 138. The corresponding control signals C and D are applied to gate terminals of the fifth and sixth NMOS transistors 138 and 139, respectively, for independently controlling the conducting state of each of the fifth and sixth NMOS transistors 128 and 129.

The output voltage control unit 140-1 is composed of first to fourth P-type (e.g., PMOS) transistors 141 to 144, and fifth to seventh PMOS transistors 145 to 147. Source terminals of the first and fifth to seventh PMOS transistors 141, 145 to 147 are commonly connected to the power supply voltage VDD; and gate terminals of the first to fourth PMOS transistors 141 to 144 are commonly connected to the voltage output stage VO. Corresponding control signals E, F and G are applied to the gates of the fifth to seventh PMOS transistors 145 to 147, respectively. If the fifth PMOS transistor 145 is turned ON (conducting), the second PMOS transistor 142 is also turned ON (conducting). Accordingly, a voltage level of the node NO1 is increased depending on the turn-on (conducting) state of the first PMOS transistor 141, and the turn-on (conducting) state of the fifth PMOS transistor 145 and the second PMOS transistor 142.

Referring to FIG. 10, the current driving unit 160 is composed of the P-type (e.g., PMOS) transistor MPD as is the case of FIG. 8.

Referring to FIG. 10, the first to fourth NMOS transistors 121 to 124 in is the reset current control unit 12 01 operatively establish a first current path, and the fifth and sixth NMOS transistors 128 and 129 operatively establish a second ("dummy") current path. The second (dummy) current path is controlled by the control signals A and B, which may in turn be controlled by programmable fuses. For example, a remote programmable fuse (e.g., located with other programmable fuses in a programmable fuse unit) connected between the supply voltage VDD and the gate of NMOS transistor 129 could be blown to permanently turn OFF transistor 128. Accordingly, the reset current control unit 120-1 controls the magnitude of reset current in a manner comparable to the reset current control unit 120 shown in FIG. 8. Thus, since the voltage level of the node NO1 is lowered by establishing the second (dummy) current path (lowering the resistance between node NO1 and NO2), the reset current driven by the PMOS transistor MPD increases.

The first to fourth NMOS transistors 131 to 134 in the set current control unit 130-1 operatively establish a first current path, and the fifth and sixth NMOS transistors 138 and 139 operatively establish a dummy (second) current path. The second (dummy) current path is controlled by the control signals C and D, which may in turn be controlled by remote programmable fuses (see FIG. 11) located in a programmable fuse unit. Accordingly, the set current control unit 130-1 controls the set current magnitude in a manner comparable to the set current control unit 130 shown in FIG. 8. Thus, since the voltage level of the node NO1 is lowered by establishing the second (dummy) current path between node NO1 and NO2, the set current driven by the PMOS transistor MPD is increased.

Meanwhile, in FIG. 10, the fifth to seventh P-type (e.g. PMOS) transistors 145 to 147 in the output voltage control unit 140-1 operatively establish plural (dummy) voltage supply paths between VDD and node NO3 (NO1, VO). Cutting or connecting each of the dummy voltage supply paths is controlled by the control signals E, F and G which may be independently controlled by as many programmable fuses. Accordingly, the output voltage control unit 140-1 can increase the voltage level of the voltage output node VO in a manner comparable to the output voltage control unit 140. Due to an operational connection of one or more of the dummy voltage supply paths in the output voltage control unit 140 01, the voltage level applied to the gate terminal of the PMOS transistor MPD becomes higher so that the magnitude of the reset current or set current (the write current) is correspondingly lowered.

Figure 11:
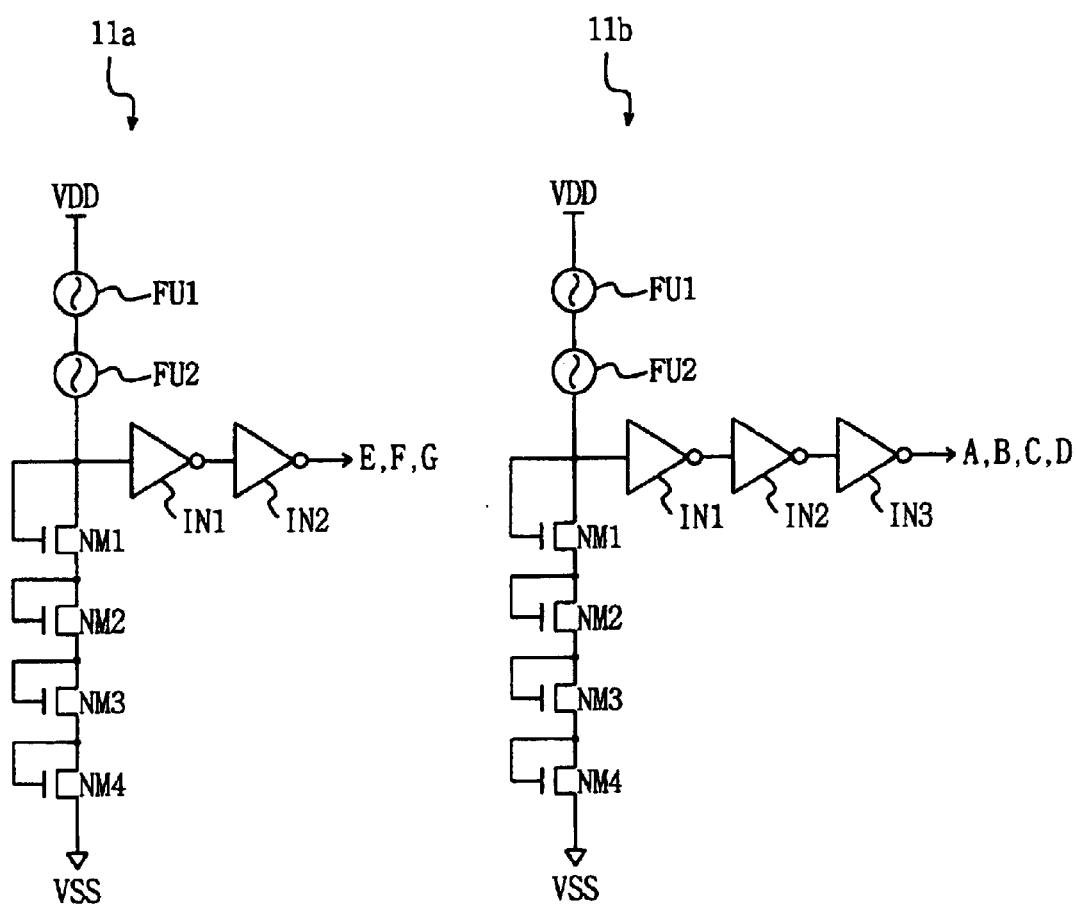
FIG. 11 is a circuit diagram showing an embodiment of control signal generation units used to generate control signals of FIG. 10.

FIG. 11 is a circuit diagram showing an exemplary embodiment of complementary control signal generation units which may be used to generate each one of control signals A through G of FIG. 10. Referring to FIG. 11, a reference numeral 11a indicates a circuit of the type that may be used to generate the control signals E, F and G (e.g., one circuit to independently generate each of the control signals E, F and G), which are applied to control the output voltage control unit 140-1; and a reference numeral 11b indicates a to complementary circuit of the type that may be used to generate the control signals A, B, C and D, which are applied to the reset current control unit 120-1 and the set current control unit 130-1.

The circuit 11a (used to generate one of the control signals E, F and G) includes programmable fuses FU1 and FU2, and NMOS transistors NM1 to is NM4 that functioning as diodes that are connected in cascade, and inverters IN1 and IN2. For example, if the control signal E is to be generated at a logic low, (e.g., where it is necessary to lower the output level of the reset current or set current), one or both of the programmable fuses FU1 and FU2 are cut. Then, since the power supply voltage VDD is not provided to an input node of the inverter IN1, the output of the inverter IN2 (E, F, G) becomes logic low.

The circuit 11b (used to generate one of the control signals A, B, C and D) includes programmable fuses FU1 and FU2, NMOS transistors NM1 to NM4 functioning as diodes that are connected in cascade, and inverters IN1 to IN3. For example, if the control signal A is to be generated at a logic high, (e.g., where it is necessary to raise the output level of the reset current), one or both of the programmable fuses FU1 and FU2 are cut. Then, since the power supply voltage VDD is not provided to an input node of the inverter IN1, the output of the inverter IN3 (e.g., A, B, C, D) becomes logic high.

Figure 12:
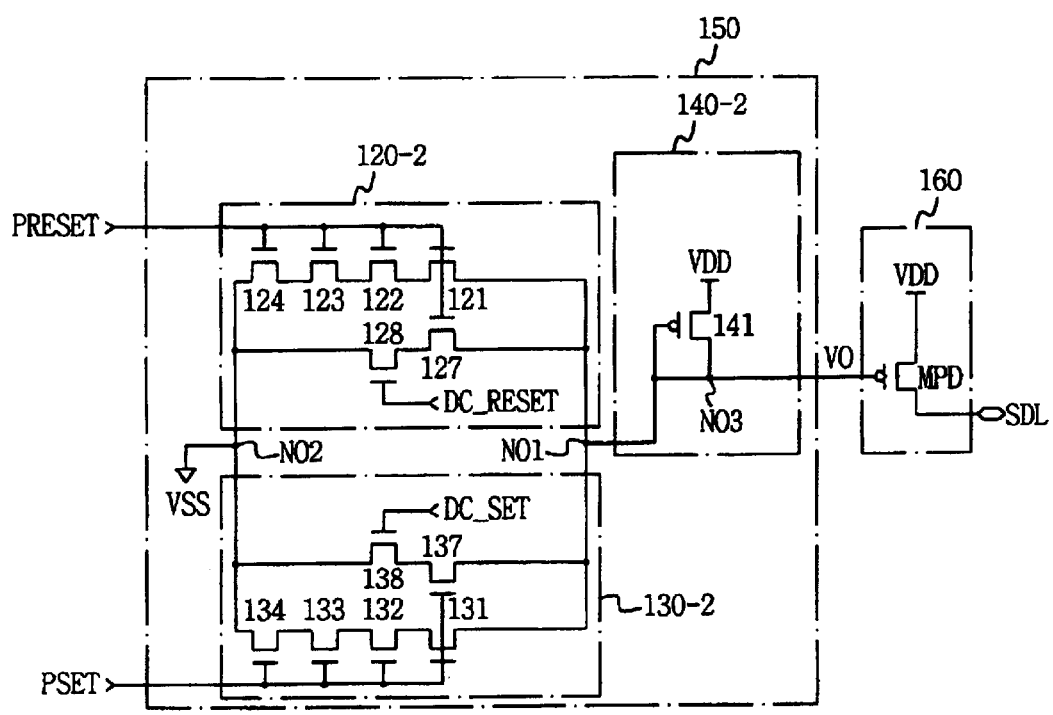
FIG. 12 is a circuit diagram of a third embodiment of the write current control unit and current driving unit of the write driver circuit of FIG. 6.

FIG. 12 is a circuit diagram showing a third embodiment of the write current control unit and current driving unit 150 of FIG. 6. Referring to FIG. 12, a reset current control unit 120-2 is composed of first to fourth N-type (e.g., NMOS) transistors 121 to 124, and fifth and sixth NMOS transistors 127 and 128. The first to fourth NMOS transistors 121 to 124, are serially connected with one another (drain-to-source), between node NO1 and ground (NO2). The first to fourth NMOS transistors 121 to 124, and fifth NMOS transistor 127, receive the first selection pulse signal PRESET in common at their respective gate terminals. The source terminal of the sixth NMOS transistor 128 is connected to the ground (node NO2), and its drain terminal is connected to node NO1 through the source sate channel of the fifth NMOS transistor 127, and its gate terminal is connected to control signal DC-RESET. For example, according to a voltage level of the control signal DC-RESET applied to the gate terminal of the sixth NMOS transistor 128, the magnitude of the current flowing through the drain-source channel of the sixth NMOS transistor 128 is increased or decreased. The first to fourth NMOS transistors 121 to 124 in the reset current control unit 120-2 operatively establish the first current path, and the fifth and sixth NMOS transistors 127 and 128 operatively establish the second (dummy) (programmable) current path. The programmable second (dummy) current path is controlled by the control signal DC-RESET that may be in turn controlled by programmable fuses. Accordingly, the reset current control unit 120-2 functions to increase or decrease the reset current. Thus, since the voltage level of the node NO1 becomes higher or lower by varying the resistance through the second (dummy) current path, the write current driven by the PMOS transistor MPD may be controllably decreased or increased.

Similarly, the set current control unit 13-2 is composed of first to fourth N-type (e.g., NMOS) transistors 131 to 134, and the fifth and sixth NMOS transistors 137 and 138. The first to fourth NMOS transistors 131 to 134 serially connected with one another (of drain-to-source) between node NO1 and ground (node NO2). The first to fourth NMOS transistors 131 to 134, and fifth NMOS transistor 137 receive the second selection pulse signal PSET through their respective gate terminals. The source terminal of the sixth NMOS transistor 138 is connected to the ground (node NO2), its drain terminal is electrically connected to node NO1 through the source-gate channel of the fifth NMOS transistor 137, and its gate terminal is connected to the control signal DC-SET. For example, according to the voltage level of the control signal DC-SET applied to the gate terminal of the sixth NMOS transistor 138, the magnitude of current flowing through the drain-source channel of the sixth NMOS transistor 138 may be controlled to be increased or decreased. Here, the first to fourth NMOS transistors 131 to 134 in the reset current control unit 130-2 operatively establish the first current path, and the fifth and sixth NMOS transistors 137 and 138 operatively establish the second (dummy) (programmable) current path. The dummy current path is controlled by the control signal DC-SET that in turn may be controlled by programmable fuses. Accordingly, the set current control unit 130-2 has the function of controllably increasing or decreasing the set current. Thus, since the voltage level of node NO1 is increased or decreased by varying the resistance through the second (dummy) current path, the magnitude of the set current output through the drain terminal of the PMOS transistor MPD is programmably decreased or increased.

Referring to FIG. 12, an output voltage control unit 140-2 is composed of one PMOS transistor 141. A source terminal of the PMOS transistor 141 is connected to the power supply voltage VDD, and its gate terminal and drain terminal are connected to the voltage output stage VO (node NO1, NO3) Accordingly, the PMOS transistor 141 provides the node NO1 with the voltage that is generated according to its current driving capability (resistance) when the transistor 141 is turned ON.

It understood that the current driving unit 160 of FIG. 12 may be composed of same the PMOS transistor MPD as in FIG. 8.

Figure 13:
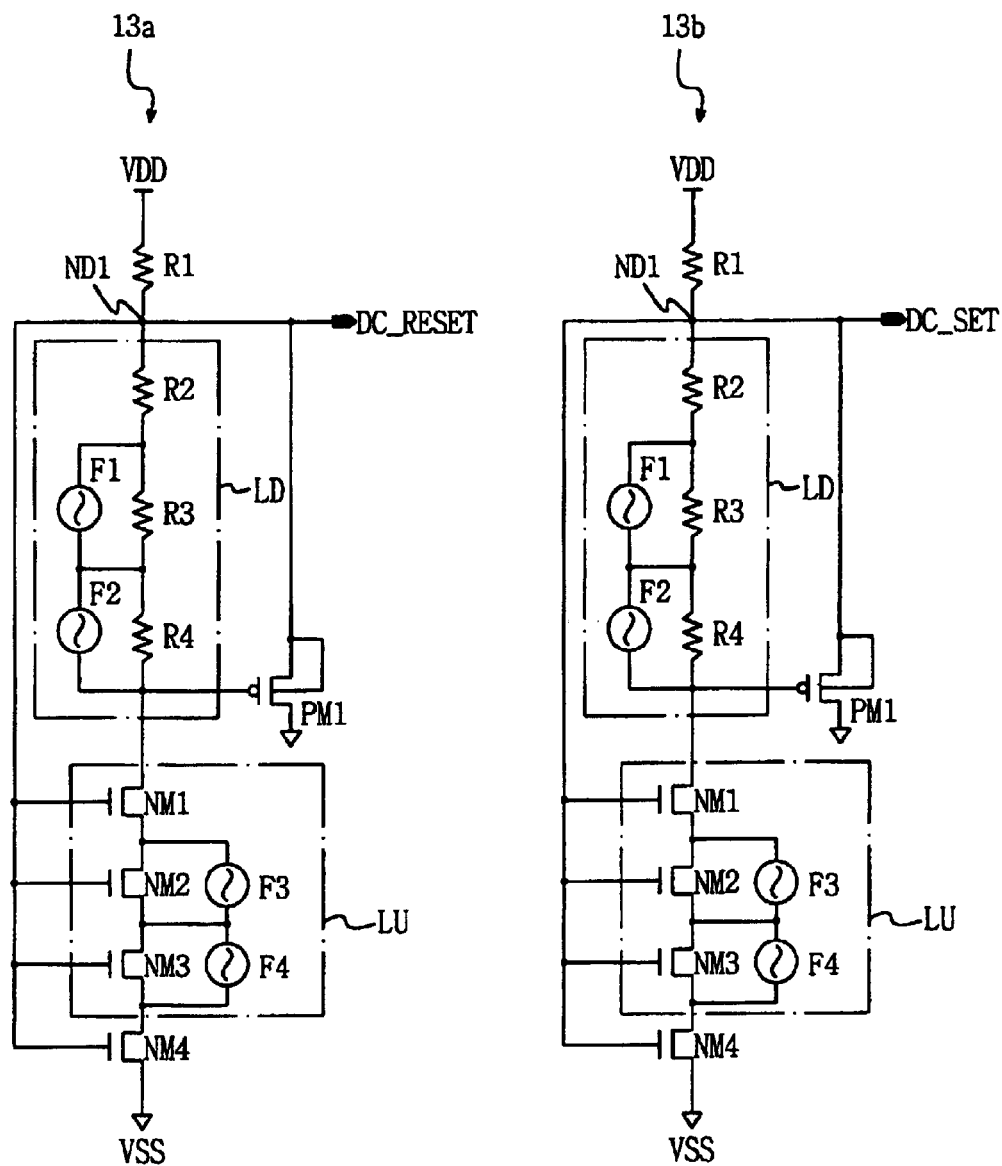
FIG. 13 is a circuit diagram showing an embodiment of the control signal generation units to generate increase and decrease control signals of FIG. 10.

FIG. 13 is a circuit diagram showing an exemplary embodiment of the control signal generation units to generate the control signals DC_RESET and DC_SET of FIG. 12. Referring to FIG. 13, a reference numeral 13a indicates a circuit that may be used to generate the control signal DC-RESET (which is applied to the reset current control unit 120-2), and a reference numeral 13b indicates a circuit that may be used to generate the control signal DC-SET (which is applied to the set current control unit 130-2).

The circuit 13a used to generate the control signal DC-RESET is composed of four serially connected resistors R1, R2, R3, and R4, and four fuses F1, F2, F3, and F4, and four NMOS transistors NM1, NM2, NM3, and NM4 that are connected in series, and a PMOS transistor PM1. Here, if either or both of the fuses F1 and F2 within a level down unit LD are cut, since the resistors R3 and R4 resist a current flowing from the node ND1 to the ground VSS, the voltage applied to the gate terminal of the PMOS transistor PM1 is lowered. Accordingly, the PMOS transistor PM1 serves to decrease the voltage of control signal DC_RESET to by decreasing the voltage of the node ND1 compared with the case of before the fuses are cut. Therefore, when one or more of fuses F1 and F2 are cut, the voltage level of the DC-RESET is lowered. If the voltage level of the control signal DC-RESET is lowered, then the current flowing through the second (dummy) current path within the reset current control unit 120-2 is reduced, consequently, the reset current for the write operation is decreased.

On the other hand, if one or both of the fuses F3 and F4 within the level increase unit LU are cut, since the NMOS transistors NM2 and NM3 resist the current flowing between the gate of PMOS transistor PM1 and the ground VSS, the voltage applied to the gate terminal of the PMOS transistor PM1 becomes higher. Accordingly, since the PMOS transistor PM1 is weakly turned on compared when one or both of the fuses F3 and F4 are cut, the voltage level of the control signal DC-RESET becomes higher. If the voltage level of the control signal DE-RESET becomes higher, since current flowing through the second (dummy) current path between node NO1 and ground (NO2) within the reset current control unit 120-2 is increased, it results that the reset current for the write operation is increased. Similarly, the circuit 13b used to generate the control signal DC-SET is composed of serially connected resistors R1, R2, R3, and R4, fuses F1, F2, F3, and F4 used to programmably change a control signal's voltage, NMOS transistors NM1, NM2, NM3, and NM4 that are connected in series, and a PMOS transistor PM1. Here, if one or both of the fuses F1 and F2 within the level down unit LD are cut, since the resistors R3 and R4 resist current flowing from the node ND1 to the ground VSS, the voltage applied to the gate terminal of the PMOS transistor PM1 is lowered. Accordingly, the PMOS transistor PM1 decreases the voltage of the node ND1 compared with the case of before either of the fuses are cut. Therefore, the voltage level of the control signal DC-SET is lowered. If the voltage level of the control signal DC-SET is lowered, the current flowing through the second (dummy) current path within the set current control unit 130-2 (F1G. 12) is reduced and, consequently, the set current for the write operation is decreased.

On the other hand, if the fuses F3 and F4 within the level increase unit LU of 13b are cut, since the NMOS transistors NM2 and NM3 resist current, the voltage applied to the gate terminal of the PMOS transistor PM1 becomes higher. Accordingly, since the PMOS transistor PM1 is weakly turned on, the direct level of the control signal DC-SET becomes higher. In the case where the voltage level of the control signal DE-SET becomes higher, the current flowing through the dummy current path within the set current control unit 130-2 (F1G. 12) is increased, and it results that the set current used to perform the write operation is increased.

The voltage levels of the control signals DC-RESET and DC-SET generated in the circuits 13a and 13b of F1G. 13 are used to programmably change the magnitude of reset current and set current. It is within the ability of persons skilled in the art to select suitable resistance values for the resistors in the circuits 13a and 13b.

As can be seen from the foregoing description of the exemplary embodiments, even in the case where the write current generation circuit (write driver circuit 100) does not output a prescribed (rated) reset current or set current due to manufacturing factor or a slight defect such that it will has a small current output shift, it is possible to adjust the magnitude of the write current to up or down through the use of programmable fuses as in the various examples described above, and therefore obtain the rated output. Also, even in a case where the phase change memory cell having the phase change material has a phase change property shift caused by the external factor or a process variation, the write current that is supplied may be adjusted (e.g., increased or decreased) to compensate by being generated in a write driver circuit according to an embodiment of the present invention.

Although the explanation is given with reference to the drawings giving the first consideration to the exemplary embodiments of the present invention, those skilled in the art appreciate that various modifications, additions and substitutions are possible without departing from the technical spirit of the invention. For example, there is no doubt that the circuit construction, the number of the fuses and connection states In the write driver circuit can be variously changed even in the other embodiments of the Invention, without departing from the technical idea of the invention. And, the phase change memory device can be widely applied to electronic systems without being limited to mobile electronic equipment.

Because, in the present invention that provides a write driver circuit for a phase change memory device and a method for applying a write current as described above a compensated write current can be applied even when current output shift exists in the write current generation circuit or a phase change memory cell having a phase change material due to an external factor or a process change, the reliability of a write operation is maximized.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A circuit for performing a write operation in a phase change memory device having a phase change memory cell, comprising:

a programmable fuse unit for adjusting the magnitude of write current through the phase change memory cell.

2. The circuit according to claim 1, wherein the programmable fuse unit comprises laser-programmable fuses.

3. The circuit according to claim 1, wherein the programmable fuse unit comprises electrically-programmable fuses.

4. The circuit according to claim 1, wherein the magnitude of a first write current applied to establish a relatively higher resistance state of the phase change memory cell, is higher than the magnitude of a second write current applied to establish a relatively lower resistance state of the phase change memory cell.

5. A write driver circuit for a phase change memory device having a plurality of phase change memory cells each having first and second resistance states, the circuit comprising:

a write current control unit for outputting a first level of voltage by establishing a first programmable current path while a first selection pulse signal is applied, and outputting a second level of voltage by establishing a second programmable current path while a second selection pulse signal is applied.

6. The circuit of claim 5, wherein at least one of the first programmable current path and the second programmable current path comprises a programmable fuse.

7. The circuit of claim 5, wherein at least one of the first programmable current path and the second programmable current path includes a transistor having a source-to-drain resistance that is controlled by the conducting state of at least one programmable fuse.

8. The circuit of claim 7, wherein the at least one programmable fuse is a laser-programmable fuse.

9. The circuit of claim 5, further comprising:

a pulse selection unit for selecting one of first and second state pulses that are applied to change a resistance state of the phase change memory cell, in response to a logic state of the applied write data, and outputting the selected pulse as a first or second selected pulse signal; and a current driving unit for generating a write current in response to the output voltage from the write current control unit.

10. The circuit of claim 9, wherein the -pulse selection unit comprises first and second transmission gates for respectively passing one of the first and second state pulses selected based upon received write data.

11. The circuit of claim 5, wherein the write current control unit comprises:

a reset current control unit for establishing the first programmable current path that includes at least one programmable fuse in response to the first selection pulse signal and;

a set current control unit for establishing the second programmable current path that includes at least one programmable fuse in response to the second selection pulse signal and allowing current flowing through the second current path to be decreased by the programmable fuse; and an output voltage control unit that includes at least one programmable fuse, for outputting the first or second level of the voltage through a voltage output node.

12. The circuit of claim 11, further comprising a current driving unit for generating a write current in response to the output voltage from the write current control unit that includes a P-type switch having a gate terminal connected to the voltage output node of the output voltage control unit, a source terminal to receive a power supply voltage, and a drain terminal to output the write current.

13. A write driver circuit for performing a write operation in a phase change memory device having a plurality of phase change memory cells having first and second resistance states, the circuit comprising:

a write current control unit for outputting a first level of voltage by establishing a first programmable current path if a first selection pulse signal is applied, and outputting a second level of voltage by establishing a second programmable current path if a second selection-pulse signal is applied.

14. The circuit of claim 13, wherein at least one of the first programmable current path and the second programmable current path includes a programmable fuse adapted to change the resistance of one of the first programmable current path and the second programmable current path.

15. The circuit of claim 14, wherein at least one programmable fuse is adapted to change the resistance of one of the first programmable current path and the second programmable current path to compensate for a current output shift or for a phase change property shift of the phase change memory cell.

16. The circuit of claim 13, further comprising: a pulse selection unit for selecting one of first and second state pulses that are applied to change a resistance state of the phase change memory cell, in response to a logic state of the applied write data, and outputting the selected pulse as a first or second selected pulse signal; and a current driving unit for generating a write current in response to the output voltage of the write current control unit.

17. The circuit of claim 16, wherein the pulse selection unit comprises first and second transmission gates that selectively pass the first and second state pulses based upon write data received at their respective control terminals.

18. The circuit of claim 16, wherein the write current control unit comprises:

a reset current control unit for establishing the first programmable current path in response to the first selection pulse signal;

a set current control unit for establishing the second programmable current path in response to the second selection pulse signal; and an output voltage control unit having a voltage output node connected to the first and second current paths that outputs the first and second levels of voltage depending on the quantity of current flowing through the selected one first and second current paths.

19. The circuit of claim 18, wherein the first programmable current path includes at least one programmable fuse adapted to enable a change of the resistance of the first programmable current path; and the second programmable current path includes at least one programmable fuse adapted to enable a change of the resistance of the second programmable current path.

20. The circuit of claim 19, wherein the current driving unit is composed of a P-type switch having a gate terminal connected to the voltage output node of the output voltage control unit, a source terminal connected to a power supply voltage, and a drain terminal to output the write current.

21. A write driver circuit for a phase change memory device having an array of phase change memory cells having first and second resistance states, the circuit comprising:

a pulse selection unit for selecting one of first and second state pulses that are applied to change the resistance state of a phase change memory cell based upon the logic state of applied write data, and for outputting the selected pulse as a first or second selected pulse signal;

a write current control unit for outputting a first level of voltage by establishing a first current path having a first programmable resistance, and outputting a second level of voltage by establishing a second current path having a second programmable resistance if the second selection pulse signal is applied; and a current driving unit for generating a write current in response to the output voltage of the write current control unit.

22. The circuit of claim 21, wherein the pulse selection unit comprises first and second transmission gates that selectively pass the first and second state pulses based upon the applied write data received at their control terminals.

23. The circuit of claim 22, wherein the write current control unit comprises:

a reset current control unit for establishing the first current path in response to the first selection pulse signal, the resistance of the first current path being changeable using at least one programmable fuse;

a set current control unit for establishing the second current path in response to the second selection pulse signal and the resistance of the second current path being changeable using at least one programmable fuse; and an output voltage control unit having a voltage output node connected to the first and second current paths, and outputting a selected one of the first and second level of voltages through the voltage output node, the actual voltage of selected one of the first and second level of voltages depending on the quantity of current flowing through the first or second current paths.

24. The circuit of claim 23, wherein the current driving unit is composed of a P-type transistor having a gate terminal connected to the voltage output node of the output voltage control unit.

25. The circuit of claim 24, wherein the resistance of the first current path changes in response to an output voltage of a first DC output circuit that includes at least one programmable fuse for controlling the voltage of the output voltage.

26. The circuit of claim 25, wherein the resistance of the second current path changes in response to an output voltage of a second DC output circuit that includes at least one programmable fuse for controlling the voltage of the output voltage.

27. A method for applying write currents to a phase change memory cell in a phase change memory device, the method comprising the step of:

adjusting the magnitude of a first write current determined by a first logic state of write data by programming a first fuse.

28. The method of claim 27, wherein the first fuse is a laser-programmable fuse.

29. The method of claim 27, wherein the first write current is a set current for crystallizing a phase change material in the phase change memory cell.

30. The method of claim 29, further comprising the step of adjusting the magnitude of a second write current determined by a second logic state of write data by programming a second fuse.

31. The method of claim 30, wherein the second fuse is a laser-programmable fuse.

32. The method of claim 31, wherein the second write current is a reset current for amorphizing the phase change material in the phase change memory cell.

33. The method of claim 30, wherein the first logic state is a logic "0" and the second logic state is a logic "1".

* * * * *